(12) United States Patent
Miyasaka et al.

(10) Patent No.: US 11,191,157 B2
(45) Date of Patent: Nov. 30, 2021

(54) SEMICONDUCTOR DEVICE HAVING BUFFER STRUCTURE FOR EXTERNAL TERMINALS

(71) Applicant: FUJI ELECTRIC CO., LTD., Kawasaki (JP)

(72) Inventors: Toshiyuki Miyasaka, Matsumoto (JP); Yuichiro Hinata, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/105,070

(22) Filed: Nov. 25, 2020

(65) Prior Publication Data

US 2021/0235579 A1 Jul. 29, 2021

(30) Foreign Application Priority Data

Jan. 23, 2020 (JP) .............................. JP2020-008925

(51) Int. Cl.
*H05K 1/11* (2006.01)
*H05K 1/02* (2006.01)
(Continued)

(52) U.S. Cl.
CPC ........... *H05K 1/0278* (2013.01); *H01L 25/18* (2013.01); *H05K 1/18* (2013.01); *H05K 3/284* (2013.01);
(Continued)

(58) Field of Classification Search
CPC ............. H05K 1/112; H05K 1/14–144; H05K 1/0278; H05K 25/18; H05K 2201/09063;
(Continued)

(56) References Cited

U.S. PATENT DOCUMENTS 5,373,110 A * 12/1994 Inasaka .................. H05K 3/303
174/267
2003/0162434 A1* 8/2003 Kamiya ............... H01R 43/205
439/381

(Continued)

FOREIGN PATENT DOCUMENTS

JP      H05-191096 A    7/1993
JP      2011-114979 A    6/2011
(Continued)

*Primary Examiner* — Hoa C Nguyen
(74) *Attorney, Agent, or Firm* — Rabin & Berdo, P.C.

(57) ABSTRACT

A semiconductor device, including a first board, a second board having a plurality of through holes passing therethrough, and a plurality of external terminals that are respectively press-fitted into the plurality of through holes of the second board, one end portion of each external terminal passing through the corresponding through hole and being fixed to a front surface of the first board. The second board is a printed circuit board that further includes, in a top view thereof, a plurality of support regions, each having one of the plurality of through holes formed therein, and a plurality of buffer regions respectively surrounding the plurality of support regions, each buffer region having at least one buffer hole and at least one torsion portion formed therein, the at least one torsion portion being connected to the support region surrounded by each buffer region.

7 Claims, 13 Drawing Sheets

(51) Int. Cl.
*H01L 25/18* (2006.01)
*H05K 1/18* (2006.01)
*H05K 3/34* (2006.01)
*H05K 3/28* (2006.01)

(52) U.S. Cl.
CPC . *H05K 3/3447* (2013.01); *H05K 2201/09063* (2013.01); *H05K 2201/0969* (2013.01); *H05K 2201/09072* (2013.01); *H05K 2201/10166* (2013.01); *H05K 2201/10174* (2013.01); *H05K 2201/10303* (2013.01)

(58) Field of Classification Search
CPC . H05K 2201/09072; H05K 2201/0969; H05K 2201/10166; H05K 2201/10174; H05K 2201/10303
See application file for complete search history.

(56) References Cited

U.S. PATENT DOCUMENTS

| | | | |
|---|---|---|---|
| 2008/0032517 A1* | 2/2008 | Pai | H01R 12/523 439/61 |
| 2008/0079505 A1* | 4/2008 | Kuroda | H05K 3/301 331/68 |
| 2013/0050954 A1* | 2/2013 | Albrecht, III | H05K 7/20454 361/720 |
| 2015/0223339 A1 | 8/2015 | Nakamura et al. | |
| 2015/0380393 A1 | 12/2015 | Nakamura et al. | |
| 2016/0079133 A1* | 3/2016 | Nashida | H01L 25/18 257/690 |
| 2016/0233146 A1 | 8/2016 | Nakamura | |
| 2016/0278209 A1* | 9/2016 | Perez-Uria | H01R 12/58 |
| 2017/0077068 A1 | 3/2017 | Horio et al. | |
| 2017/0359906 A1* | 12/2017 | Hosoda | H03B 5/32 |
| 2018/0114735 A1* | 4/2018 | Nakamura | H01L 23/16 |
| 2018/0177007 A1* | 6/2018 | Mehnert | H05K 1/0274 |
| 2019/0287887 A1 | 9/2019 | Nakamura et al. | |

FOREIGN PATENT DOCUMENTS

| | | |
|---|---|---|
| JP | 2019-161174 A | 9/2019 |
| WO | 2014/061211 A1 | 4/2014 |
| WO | 2014/185050 A1 | 11/2014 |
| WO | 2014/192298 A1 | 12/2014 |
| WO | 2015/151235 A1 | 10/2015 |

* cited by examiner

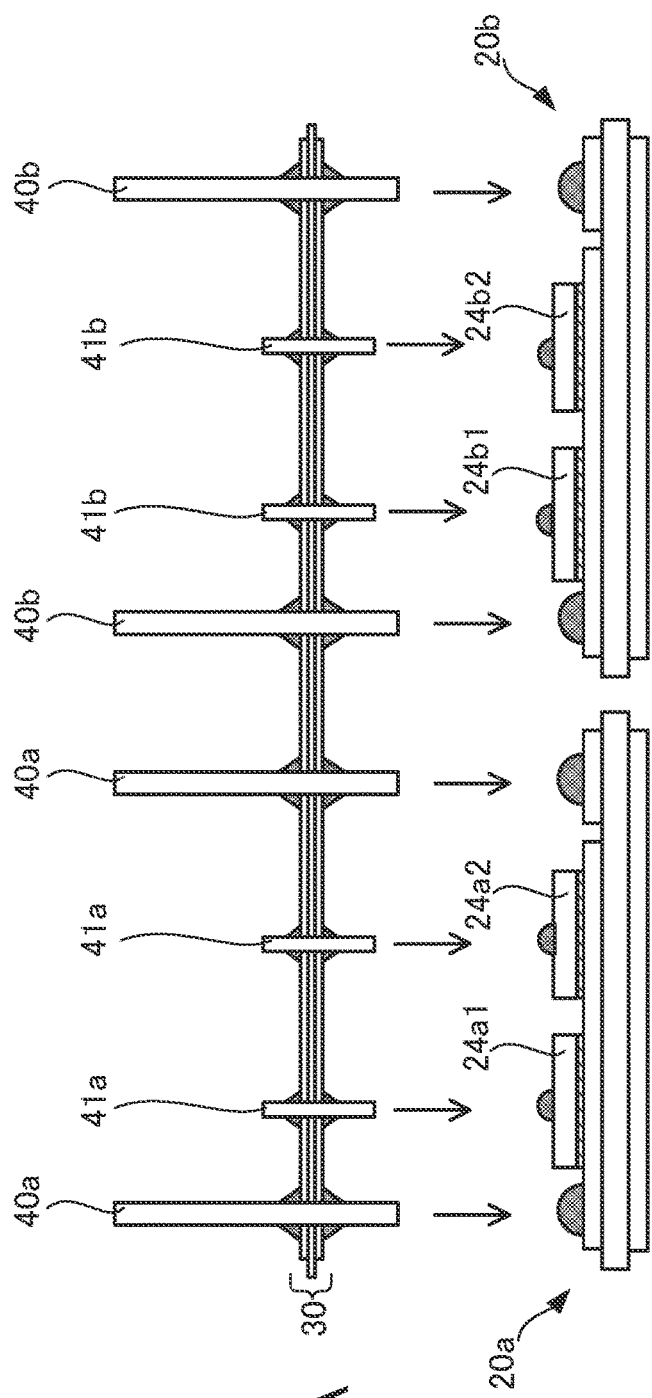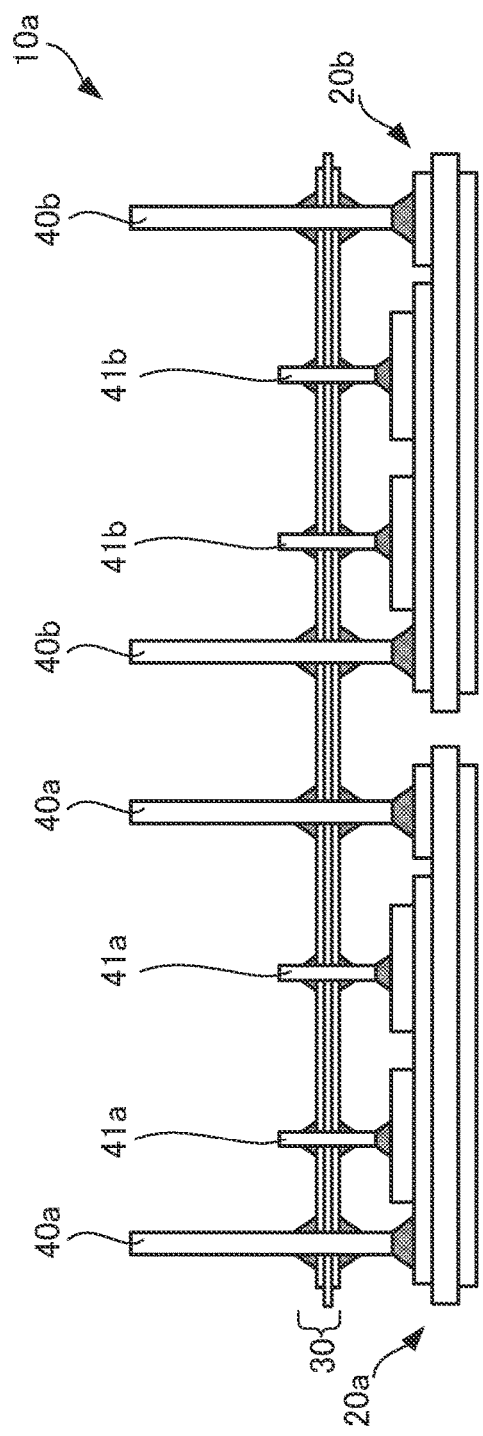
FIG. 7A
FIG. 7B

SEMICONDUCTOR DEVICE HAVING BUFFER STRUCTURE FOR EXTERNAL TERMINALS

CROSS-REFERENCE TO RELATED APPLICATION

This application is based upon and claims the benefit of priority of the prior Japanese Patent Application No. 2020-008925, filed on Jan. 23, 2020, the entire contents of which are incorporated herein by reference.

BACKGROUND OF THE INVENTION

1. Field of the Invention

The embodiments discussed herein relate to a semiconductor device having buffer structure for external terminals.

2. Background of the Related Art

Semiconductor devices are equipped with semiconductor chips, including power devices, and are used as power converter devices. The power devices referred to here are switching elements, such as IGBTs (Insulated Gate Bipolar Transistors) or power MOSFETs (Metal Oxide Semiconductor Field Effect Transistors).

A semiconductor device of this type includes an insulated circuit board, semiconductor chips, and a printed circuit board. The insulated circuit board includes a ceramic board and a plurality of circuit patterns provided on the ceramic board. The semiconductor chips are mounted on predetermined circuit patterns. Predetermined circuits are formed on the printed circuit board. External terminals are press-fitted into through-holes in the printed circuit board so as to pass through. The external terminals attached to the printed circuit board are joined to the predetermined circuit patterns on the insulated circuit board. A semiconductor device is manufactured by setting this structure in a mold and injecting resin into the mold. Note that various methods are used to attach rod-shaped terminals and the like to boards, such as printed circuit boards (see, for example, Japanese Laid-open Patent Publication No. 2019-161174, International Publication Pamphlet No. WO2014/061211, International Publication Pamphlet No. WO2014/185050, International Publication Pamphlet No. WO2014/192298, and International Publication Pamphlet No. WO2015/151235). One example method of attaching the terminals is to attach terminal pieces via terminal receivers to through-holes in a board (see, for example, Japanese Laid-open Patent Publication No. 2011-114979). Another example method is to attach positioning pins to holes in a ceramic board via thin-walled brass cylinders (see, for example, Japanese Laid-open Patent Publication No. 05-191096).

The components included in a semiconductor device will differ due to dimensional tolerances and assembly tolerances. This means that when external terminals, as one of these components, are press-fitted into a printed circuit board and joined to an insulated circuit board, there is variation in the heights of the external terminals. When an insulated circuit board and the like are set in a mold in a state where there is variation in the heights of the external terminals, any external terminals that protrude more than others will be pressed by the mold. Depending on the pressing force and the pressing direction on the external terminals contacted and pressed by the mold, this may result in deformation of the external terminals. In addition, as the external terminals deform, a load may be applied to and damage the printed circuit board into which the external terminals have been press-fitted. A semiconductor device whose printed circuit board has been damaged in this way is likely to have lower reliability.

SUMMARY OF THE INVENTION

According to an aspect, there is provided a semiconductor device including: a first board; a second board having a plurality of through holes passing therethrough; and a plurality of external terminals that are respectively press-fitted into the plurality of through holes of the second board, one end portion of each external terminal passing through the corresponding through hole and being fixed to a front surface of the first board, wherein the second board is a printed circuit board that further includes, in a top view thereof, a plurality of support regions, each having one of the plurality of through holes formed therein, and a plurality of buffer regions respectively surrounding the plurality of support regions, each buffer region having at least one buffer hole and at least one torsion portion formed therein, the at least one torsion portion being connected to the support region surrounded by each buffer region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 7A and 7B depict mounting of a printed circuit board and the like in the method of manufacturing a semiconductor device according to the first embodiment;

DETAILED DESCRIPTION OF THE INVENTION

Several embodiments will be described below with reference to the accompanying drawings. Note that in the following description, the expressions "front surface" and "upper surface" refer to the surface of a semiconductor device 10 that faces upward in FIG. 1. In the same way, the expression "up" refers to the upward direction for the semiconductor device 10 in FIG. 1. The expressions "rear surface" and "lower surface" refer to the surface of the semiconductor device 10 that faces downward in FIG. 1. In the same way, the expression "down" refers to the downward direction for the semiconductor device 10 in FIG. 1. These expressions indicate the same directions as needed in the other drawings. The expressions "front surface", "upper surface", "up", "rear surface", "lower surface", "down", and "side surface" are merely convenient expressions used to specify relative positional relationships, and are not intended to limit the technical scope of the present embodiments. As one example, "up" and "down" do not necessarily mean directions that are perpendicular to the ground. That is, the "up" and "down" directions are not limited to the direction of gravity.

First Embodiment

Figure 1:
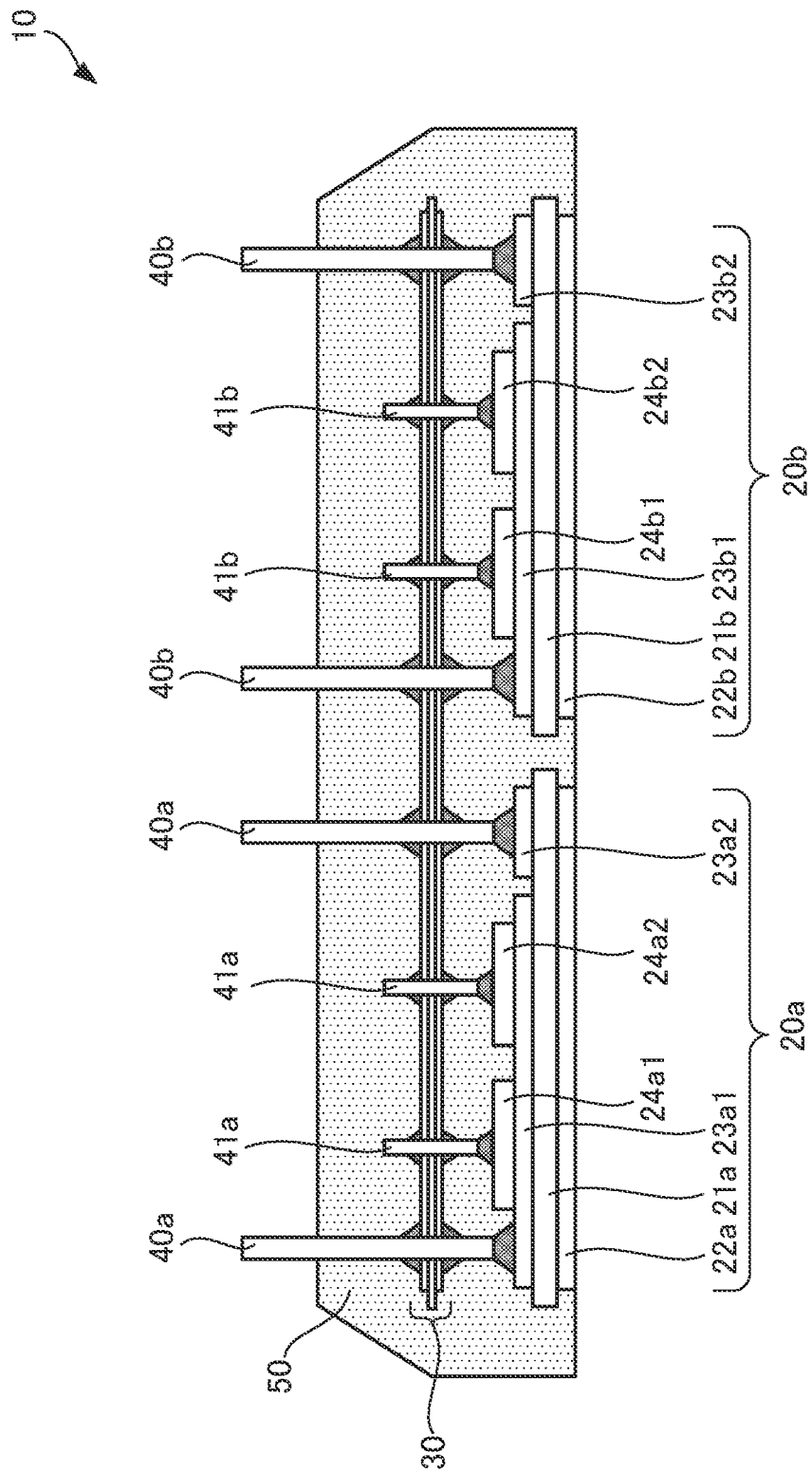
FIG. 1 is a cross-sectional view of a semiconductor device according to the first embodiment.
Figure 2:
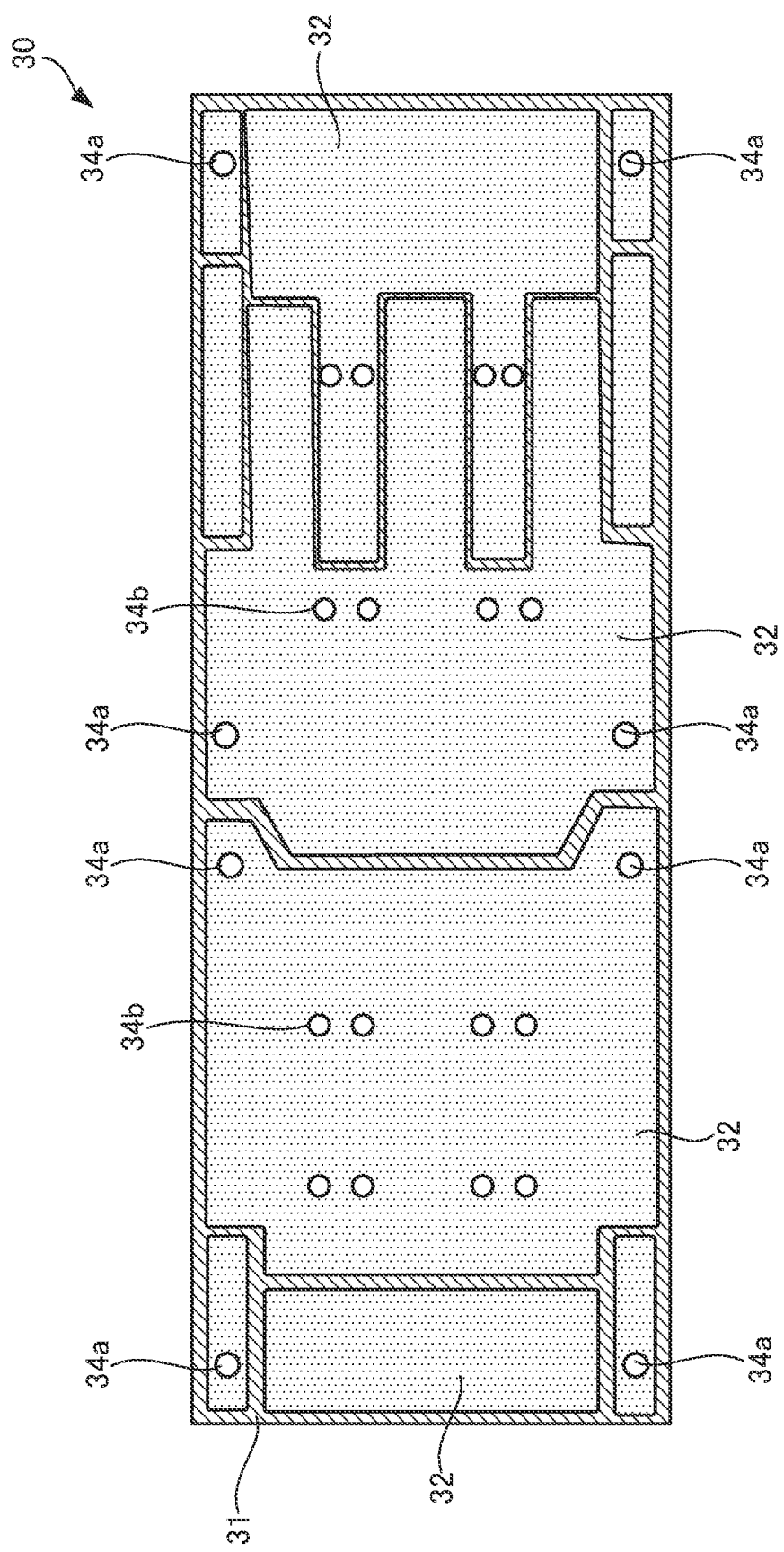
FIG. 2 is a plan view of a printed circuit board included in the semiconductor device according to the first embodiment.

A semiconductor device according to a first embodiment will now be described with reference to FIGS. 1 and 2. FIG. 1 is a cross-sectional view of the semiconductor device according to the first embodiment and FIG. 2 is a plan view of a printed circuit board included in the semiconductor device according to the first embodiment. Note that the semiconductor device 10 is rectangular when seen from above. FIG. 1 depicts a cross section taken parallel to the length of the semiconductor device 10. In FIG. 2, only the upper surface side of the printed circuit board 30 is depicted. In addition, buffer regions formed around through holes 34a and 34b of the printed circuit board 30 have been omitted from FIG. 2.

As depicted in FIG. 1, the semiconductor device 10 includes insulated circuit boards 20a and 20b, semiconductor chips 24a1, 24a2, 24b1, and 24b2, a printed circuit board 30, external terminals 40a and 40b, and conductive posts 41a and 41b. In the semiconductor device 10, these components are sealed by a sealing member 50. This example semiconductor device 10 is sealed by the sealing member 50 so that the rear surfaces of the insulated circuit boards 20a and 20b are exposed.

The insulated circuit boards 20a and 20b are disposed side by side in the horizontal direction. The insulated circuit boards 20a and 20b include insulating boards 21a and 21b, metal plates 22a and 22b provided on the rear surfaces of the insulating boards 21a and 21b, and circuit patterns 23a1, 23a2, 23b1, and 23b2 provided on the front surfaces of the insulating boards 21a and 21b. The insulating boards 21a and 21b and the metal plates 22a and 22b are rectangular when seen from above. Corner portions of the insulating boards 21a and 21b and the metal plates 22a and 22b may be chamfered into a rounded or beveled shape. When seen from above, the metal plates 22a and 22b are smaller than the insulating boards 21a and 21b and are formed inside the insulating boards 21a and 21b. The insulating boards 21a and 21b are made of a ceramic or insulating resin that has favorable thermal conductivity. Example ceramics include aluminum oxide, aluminum nitride, and silicon nitride. Example insulating resins include a paper phenol board, a paper epoxy board, a glass composite board, and a glass epoxy board. The metal plates 22a and 22b are made of a metal with superior thermal conductivity. Example metals include aluminum, iron, silver, copper, and an alloy containing at least one of these metals. The thickness of the metal plates 22a and 22b is at least 0.1 mm but no greater than 4.0 mm. The surfaces of the metal plates 22a and 22b may be plated to improve corrosion resistance. When doing so, examples of the plating material include nickel, nickel-phosphorus alloy, and nickel-boron alloy. The circuit patterns 23a1, 23a2, 23b1, and 23b2 are made of a metal with superior electrical conductivity. Example metals include silver, copper, nickel, and an alloy containing at least one of these metals. The thickness of the circuit patterns 23a1, 23a2, 23b1, and 23b2 is at least 0.1 mm but no greater than 4.0 mm. The surfaces of the circuit patterns 23a1, 23a2, 23b1, and 23b2 may be plated to improve corrosion resistance. Examples of the plating material used here include nickel, nickel-phosphorus alloy, and nickel-boron alloy. The circuit patterns 23a1, 23a2, 23b1, and 23b2 are obtained by forming a metal layer on the front surfaces of the insulating boards 21a and 21b and subjecting the metal layer to processing such as etching. Alternatively, the circuit patterns 23a1, 23a2, 23b1, and 23b2 may be cut out in advance from a metal layer and then pressure-bonded to the front surfaces of the insulating boards 21a and 21b. Note that the circuit patterns 23a1, 23a2, 23b1, and 23b2 depicted in FIG. 1 are mere examples. The number, shape, size, and the like of the circuit patterns may be appropriately selected. As examples, DCB (Direct Copper Bonding) boards, AMB (Active Metal Brazed) boards, or resin insulating boards may be used as the insulated circuit boards 20a and 20b made of these components.

The semiconductor chips 24a1 and 24b1 include switching elements. As examples, the switching elements are IGBTs or power MOSFETs. When the semiconductor chips 24a1 and 24b1 are IGBTs, a collector electrode is provided on the rear surface as a main electrode, and a gate electrode and an emitter electrode as a main electrode are provided on the front surface. When the semiconductor chips 24a1 and 24b1 are power MOSFETs, a drain electrode is provided on the rear surface as a main electrode, and a gate electrode and a source electrode as a main electrode are provided on the front surface. The rear surfaces of the semiconductor chips 24a1 and 24b1 described above are joined to the circuit patterns 23a1 and 23b1 by solder (not illustrated). The conductive posts 41a and 41b are electrically and mechanically connected as appropriate to the main electrodes and the gate electrodes on the front surface of the semiconductor chips 24a1 and 24b1.

The semiconductor chips 24a2 and 24b2 include diodes, for example, FWDs (Free Wheeling Diodes) such as SBDs (Schottky Barrier Diodes) or PiN (P-intrinsic-N) diodes. These semiconductor chips 24a2 and 24b2 have an output electrode (cathode electrode) as a main electrode on the rear surface and an input electrode (anode electrode) as a main electrode on the front surface. The rear surfaces of the semiconductor chips 24a2 and 24b2 are joined to the circuit patterns 23a1 and 23b1 by solder (not illustrated). The conductive posts 41a and 41b are electrically and mechanically connected as appropriate to the main electrodes on the front surfaces of the semiconductor chips 24a2 and 24b2. Note that in place of the semiconductor chips 24a1, 24a2, 24*b*1, and 24*b*2, it is possible to use an RC (Reverse-Conducting)-IGBT that has the functions of both an IGBT and an FWD. Note here that FIG. 1 merely depicts an example configuration where the semiconductor chips 24*a*1, 24*a*2, 24*b*1, and 24*b*2 are provided. The present embodiments are not limited to this configuration, and the number of chip pairs may be provided according to the specification of the semiconductor device 10.

Lead-free solder is used as the solder (not illustrated) for joining the semiconductor chips 24*a*1, 24*a*2, 24*b*1, and 24*b*2 and the circuit patterns 23*a*1 and 23*b*1. As one example, the lead-free solder has at least one of an alloy composed of tin-silver-copper, an alloy composed of tin-zinc-bismuth, an alloy composed of tin-copper, and an alloy composed of tin-silver-indium-bismuth as a main component. The solder may also include additives, such as nickel, germanium, cobalt, or silicon. By including additives, it is possible to improve the wettability, gloss, and bonding strength of the solder, and to improve reliability.

The printed circuit board 30 is provided so as to face the horizontally arranged insulated circuit boards 20*a* and 20*b*. As depicted in FIG. 2, the printed circuit board 30 is equipped with an insulating board and a plurality of upper circuit patterns 32 that are formed on the front surface of the insulating board 31. The printed circuit board 30 also includes a plurality of lower circuit patterns 33 on the rear surface of the insulating board 31 (see FIGS. 4A and 4B). In addition, the printed circuit board 30 has a plurality of through holes 34*a* and 34*b* that pass through from the front surface to the rear surface and are formed at predetermined positions. The through holes 34*a* are formed at opposing locations in corner portions of the insulated circuit boards 20*a* and 20*b* of the printed circuit board 30. The through holes 34*b* are formed at other locations on the printed circuit board 30. Buffer regions (not illustrated) are formed around the through holes 34*a* and 34*b*. These buffer regions will be described in detail later.

The insulating board 31 is formed as a flat plate and made of an insulating material. As this material, a material obtained by immersing a substrate in resin is used. Examples of the substrate include paper, glass cloth, and glass non-woven fabric. As examples of the resin, phenol resin, epoxy resin, or polyimide resin is used. Specific examples of the insulating board 31 used here include a paper phenol board, a paper epoxy board, a glass epoxy board, a glass polyimide board, and a glass composite board. The insulating board 31 is rectangular when seen from above. Corner portions of the insulating board 31 may be chamfered into a rounded or beveled shape.

The upper circuit patterns 32 and the lower circuit patterns 33 have a plurality of pattern shapes so as to form predetermined circuits. As one example, the upper circuit patterns 32 have a plurality of pattern shapes as depicted in FIG. 2. Although not illustrated, the lower circuit patterns 33 also have a plurality of pattern shapes. The upper circuit patterns 32 and the lower circuit patterns 33 are made of a material with superior conductivity. Example materials include silver, copper, nickel, or an alloy containing at least one of these metals. The surfaces of the upper circuit patterns 32 and the lower circuit patterns 33 may be plated to improve corrosion resistance. Examples of the material used in a plating process include nickel, nickel-phosphorus alloy, and nickel-boron alloy.

As one example, the printed circuit board 30 described above is able to be formed as follows. Metal foil is attached to the front and rear surfaces of the insulating board 31 and a resist of a predetermined shape is printed on each surface. The metal foil on the front surface and the rear surface of the insulating board 31 is then etched with the printed resists as masks and the remaining resist is removed. By doing so, the upper circuit patterns 32 and the lower circuit patterns 33 are formed on the front surface and the rear surface of the insulating board 31, respectively. A hole forming process is then performed at predetermined positions on the laminated structure formed by the insulating board 31, the upper circuit patterns 32, and the lower circuit patterns 33 to form the plurality of through holes 34*a* and 34*b* and also the buffer regions (see FIG. 3). The plurality of through holes 34*a*, 34*b* and the buffer regions may be plated to improve corrosion resistance. When doing so, as examples, solder plating and electroless gold plating may be performed. A water-soluble flux treatment may also be performed.

The external terminals 40*a* are press-fitted so as to pass through the through holes 34*a* in the printed circuit board 30. When doing so, the press-fitting locations are covered with solder. The external terminals 40*a* are electrically connected to the upper circuit patterns 32 and the lower circuit patterns 33 of the printed circuit board 30. One end of each external terminal 40*a* is joined to a circuit pattern 23*a*1 or 23*a*2 of the insulated circuit board 20*a* using solder. Alternatively, openings may be provided at positions on the circuit patterns 23*a*1 and 23*a*2 of the insulated circuit board 20*a* where the external terminals 40*a* are to be attached, and one end of each external terminal 40*a* may be joined to these openings using solder. Tube-like contact components may be joined by solder to the positions on the circuit patterns 23*a*1 and 23*a*2 of the insulated circuit board 20*a* where the external terminals 40*a* are to be attached, and one end of each external terminal 40*a* may be press-fitted into these contact components. The contact components used in this configuration are made of a material with superior electrical conductivity. As examples, silver, copper, nickel, or an alloy containing at least one of these metals is used as this material. The external terminals 40*b* are press-fitted so as to pass through the through holes in the printed circuit board 30. When doing so, the press-fitting locations are covered with solder. The external terminals 40*b* are electrically connected to the upper circuit patterns 32 and the lower circuit patterns 33 of the printed circuit board 30. One end of each external terminal 40*b* is joined to a circuit pattern 23*b*1 or 23*b*2 of the insulated circuit board 20*b* using solder. Alternatively, openings may be provided at the positions on the circuit patterns 23*b*1 and 23*b*2 of the insulated circuit board 20*b* where the external terminals 40*b* are to be attached, and one end of each external terminal 40*b* may be joined to these openings using solder. Tube-like contact components may be joined by solder to the positions on the circuit patterns 23*b*1 and 23*b*2 of the insulated circuit board 20*b* where the external terminals 40*b* are to be attached, and one end of each external terminal 40*b* may be press-fitted into these contact components. The contact components used in this configuration are made of a material with superior electrical conductivity. As examples, silver, copper, nickel, or an alloy containing at least one of these metals is used as this material. The external terminals 40*a* and 40*b* are shaped as columns that are circular or rectangular in cross section. The external terminals 40*a* and 40*b* are made of a material with superior electrical conductivity. As examples, silver, copper, nickel, or an alloy containing at least one of these metals is used as this material. The surfaces of the external terminals 40*a* and 40*b* may be plated to improve corrosion resistance. Examples of the material used in a plating process include nickel, nickel-phosphorus alloy, and nickel-boron alloy. The cross-sectional diameter (for a circular cross section) or the lengths of diagonals (for a rectangular cross section) of the external terminals 40a and 40b are several percent larger than the diameters of the through holes 34a and 34b in the printed circuit board 30. Due to being larger, the external terminals 40a are press-fitted into the through holes 34a of the printed circuit board 30.

The conductive posts 41a are press-fitted so as to pass through the through holes 34b of the printed circuit board 30. When doing so, the press-fitting locations are covered with solder. The conductive posts 41a are electrically connected to the upper circuit patterns 32 and the lower circuit patterns 33 of the printed circuit board 30. One end portion of each conductive post 41a is joined to the main electrodes or control electrodes of the semiconductor chips 24a1 and 24a2 using solder. The conductive posts 41b are press-fitted so as to pass through the through holes 34b of the printed circuit board 30. When doing so, the press-fitting locations are covered with solder. The conductive posts 41b are electrically connected to the upper circuit patterns and the lower circuit patterns 33 of the printed circuit board 30. One end of each conductive post 41b is joined to the main electrodes or control electrodes of the semiconductor chips 24b1 and 24b2 using solder. The conductive posts 41a and 41b are shaped as columns that are circular or rectangular in cross section. Also, the conductive posts 41a and 41b are sufficiently shorter in length than the external terminals 40a and 40b. The conductive posts 41a and 41b are made of a material with superior electrical conductivity. As examples, silver, copper, nickel, or an alloy containing at least one of these metals is used as this material. The surfaces of the conductive posts 41a and 41b may be plated to improve corrosion resistance. Examples of the material used in a plating process include nickel, nickel-phosphorus alloy, and nickel-boron alloy. The cross-sectional diameter (for a circular cross section) or the lengths of diagonals (for a rectangular cross section) of the conductive posts 41a and 41b are several percent larger than the diameters of the through holes 34b in the printed circuit board 30. Due to being larger, the conductive posts 41a and 41b are press fitted into the through holes 34b of the printed circuit board 30.

The sealing member 50 includes a thermosetting resin, such as epoxy resin, phenol resin, or maleimide resin, and a filler that is held within the thermosetting resin. One example of the sealing member 50 is epoxy resin containing a filler. An inorganic filler is used as the filler. Examples of inorganic fillers include silicon oxide, aluminum oxide, boron nitride, and aluminum nitride. The sealing member 50 also contains a suitable amount of a release agent. Example release agents include wax-based agents, silicone-based agents, and fluorine-based agents. Note that the semiconductor device 10 is sealed by the sealing member 50 so that the metal plates 22a and 22b of the insulated circuit boards 20a and 20b are exposed on the rear surface. The metal plates 22a and 22b may be flush with the rear surface of the sealing member 50 or may project outward from the rear surface.

A cooling module (not illustrated) may be attached to the rear surface of the semiconductor device 10 using solder or silver solder. In this configuration, the cooling module is screwed to attachment holes (not illustrated) of the semiconductor device 10. By adding a cooling module, heat dissipation of the semiconductor device 10 is improved. As one example, the cooling module used in this configuration is made of a metal with superior thermal conductivity. Example metals include aluminum, iron, silver, copper, or an alloy containing at least one of these metals. As the cooling module, a heat sink composed of one or a plurality of fins, a cooling device that uses water cooling, or the like may be used. The surface of the cooling module may be plated to improve corrosion resistance. As examples, the plating material used here may be nickel, nickel-phosphorus alloy, or nickel-boron alloy.

Figure 3:
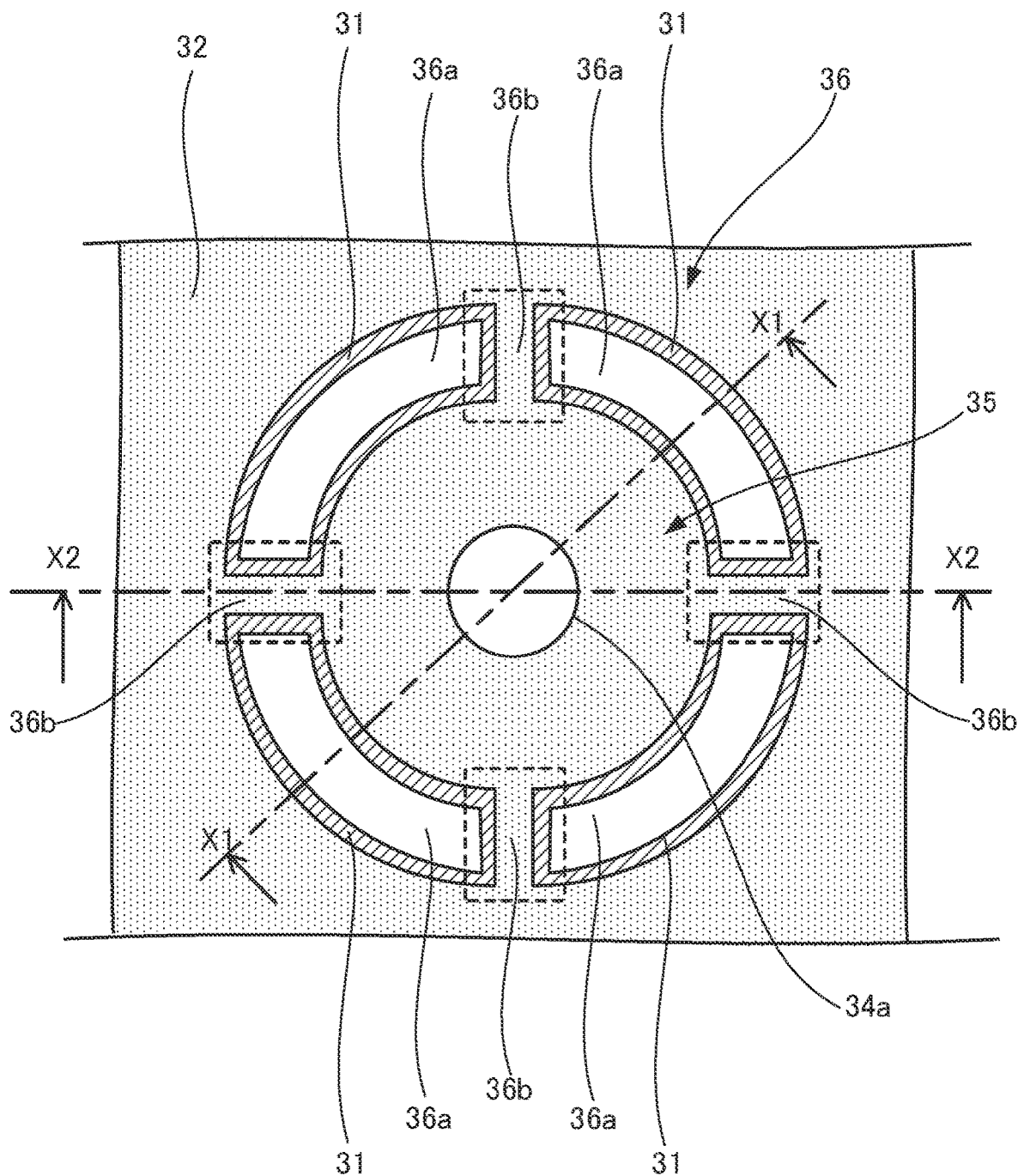
FIG. 3 is an enlarged plan view of a through hole in the printed circuit board included in the semiconductor device according to the first embodiment.
Figure 4:
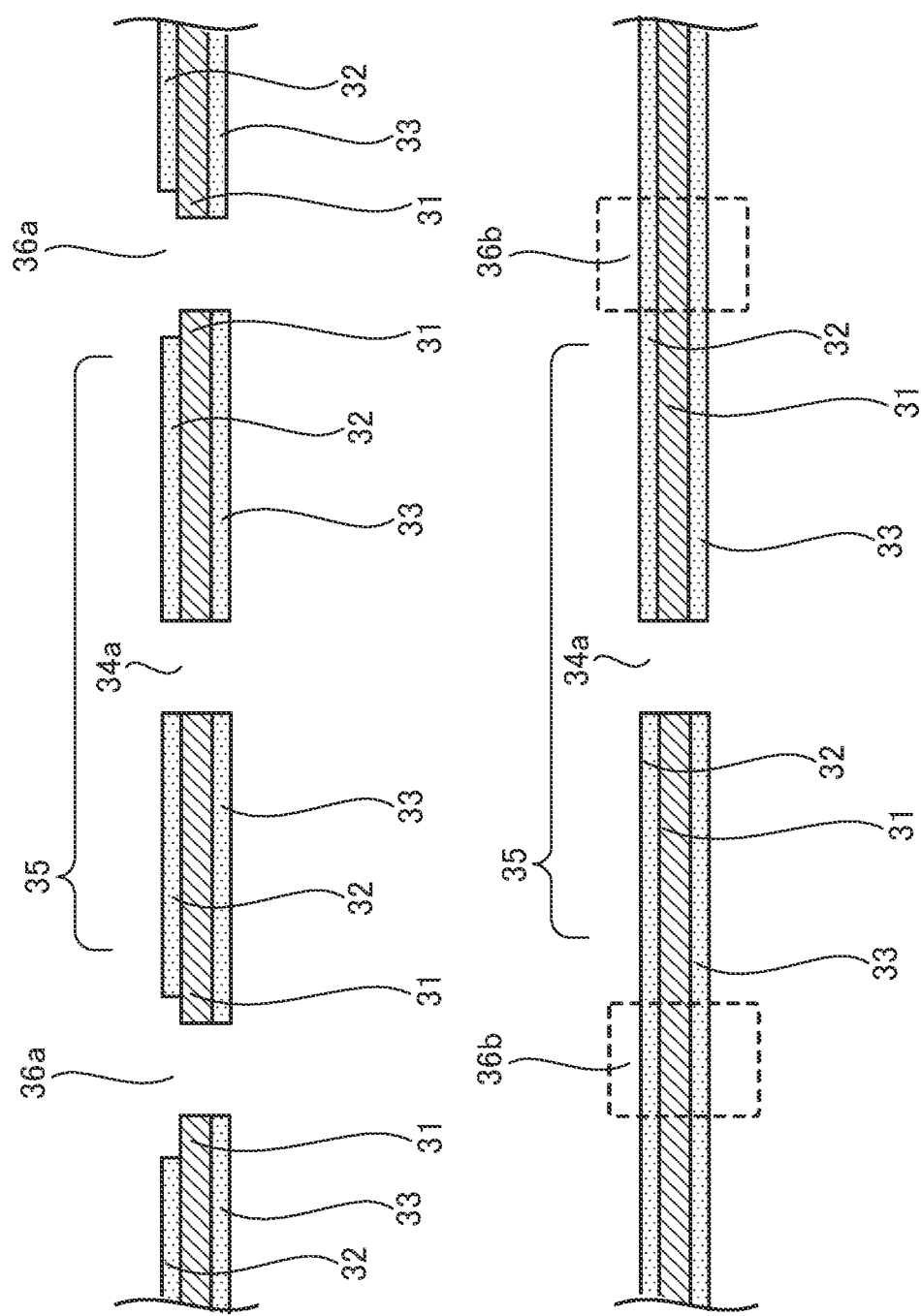
FIGS. 4A and 4B are cross-sectional views of the printed circuit board included in the semiconductor device according to the first embodiment.

Next, the buffer regions formed around the through holes 34a of the printed circuit board 30 will be described with reference to FIGS. 3, 4A, and 4B. FIG. 3 is an enlarged plan view of a through hole in a printed circuit board included in the semiconductor device according to the first embodiment, and FIGS. 4A and 4B are cross-sectional views of a printed circuit board included in the semiconductor device according to the first embodiment. Note that FIGS. 4A and 4B are cross-sectional views taken along the dot-dash lines X1-X1 and X2-X2 in FIG. 3.

On the printed circuit board 30, a buffer region 36 is formed around each support region 35 that includes a through hole 34a. Each buffer region 36 surrounds the entire circumference of a support region and has buffer holes 36a formed so as to leave torsion portions 36b connected to the support region 35.

Each support region 35 includes a through hole 34a formed in a center portion of the support region 35 and is circular when seen from above. The circular support region 35 illustrated here is merely one example, and the support region 35 may be rectangular. The buffer region 36 is provided concentrically with the support region 35. Note however that the buffer region 36 is not limited to being concentric and it is sufficient for the range of the buffer region 36 to include the support region 35. Four buffer holes 36a are formed in a buffer region 36 at equal intervals around the outer circumference of a support region 35. At the buffer holes 36a, openings are provided in the upper circuit patterns 32 by etching, for example, on the outside of each support region 35 on the printed circuit board 30. After this, the buffer holes 36a themselves are obtained by providing openings in the insulating board 31 and the lower circuit patterns 33 by further etching inside the openings in the upper circuit patterns 32. As a result, as depicted in FIGS. 3 and 4A, the insulating board 31 becomes exposed around the buffer holes 36a. Since the upper circuit pattern 32 is plated, adhesion with the sealing member 50, which is used in a subsequent sealing process, is poor. This means that the sealing member 50 may become detached from the upper circuit patterns 32, which may lead to penetration of moisture or the like where the sealing member is detached, lowering the reliability of the semiconductor device 10. In the configuration described above, the insulating board 31 exposed around the buffer holes 36a has sufficient adhesion to the sealing member 50. This means that it is possible to prevent a drop in reliability of the semiconductor device 10 that is sealed by the sealing member 50. The through holes 34a and the external terminals 40a and 40b press-fitted into the through holes 34a are soldered together. When doing so, the upper circuit patterns 32 made of copper or a copper alloy will have poor wettability with solder. This results in a tendency for the solder used to join the through holes 34a and the external terminals 40a and 40b to flow onto and stick to the insulating board 31 exposed around the buffer holes 36a. This makes it possible to reliably solder on the external terminals 40a and 40b. This effect may be achieved more reliably by increasing the area of the insulating board 31 that is exposed on the through hole 34a side of the periphery of each buffer hole 36a. As a result, as described later, a reliable seal will be achieved by the sealing member 50, even when the support region 35 has warped due to a pressing force applied to the external terminals 40a and 40b.

The torsion portions 36b are provided between adjacent buffer holes 36a and, as depicted in FIGS. 3 and 4B, connect the support region 35 to a region outside the buffer region 36. This means that the formation positions and number of the torsion portions 36b depend on the size, formation positions, and number of the buffer holes 36a. In the illustrated example, the torsion portions 36b are connected to the support region 35 at a total of four positions arranged in the vertical and horizontal directions in FIG. 3. As another example, three buffer holes 36a may be formed in the buffer region 36 at equal intervals around the circumference of the support region 35, and the torsion portions 36b may be connected to the support region 35 at the 0°, 120°, and 240° positions when looking from above. Note that "0°" here indicates the position of the torsion portion 36b at the top in FIG. 3. As another example, two buffer holes 36a may be formed in the buffer region 36 at equal intervals around the circumference of the support region 35, and the torsion portions 36b may be connected to the support region 35 at the 0° and 180° positions when looking from above. Alternatively, one buffer hole 36a may be formed in the buffer region 36 around the circumference of the support region 35 and a torsion portion 36b may be connected to the support region 35 at only the 0° position described above when looking from above.

It is preferable for each torsion portion 36b to have an elastic modulus that allows the torsion portion 36b to bend in accordance with the deformation of the support region 35 and then return to its original position. It is also preferable for all of the torsion portions 36b to have substantially the same elastic modulus. To produce torsion portions 36b that satisfy these conditions, appropriate materials need to be selected for the printed circuit board 30. In addition, the widths of the torsion portions 36b, that is, the lengths left between adjacent buffer holes 36a, need to be uniformly machined so that each torsion portion 36b has an appropriate elastic modulus. On the other hand, currents that flow from a support region 35 or to a support region 35 will flow through a region of an upper circuit pattern 32 that corresponds to a torsion portion 36b. For this reason, it is preferable for the torsion portions 36b to have a certain width that enables electrical conduction while achieving the desired elastic modulus. As one example, this width is preferably at least 15% but no greater than 25% of the diameter of the support region 35. The torsion portions 36b depicted in FIG. 3 are substantially rectangular when seen from above. The torsion portions 36b may take any shape aside from rectangular so long as the torsion portions 36b have a predetermined elastic modulus and are capable of electrical conduction. As one example, the torsion portions 36b may be trapezoidal when seen from above, with a larger (or smaller) width at the support region 35 end than at the buffer region 36 end.

Figure 5:
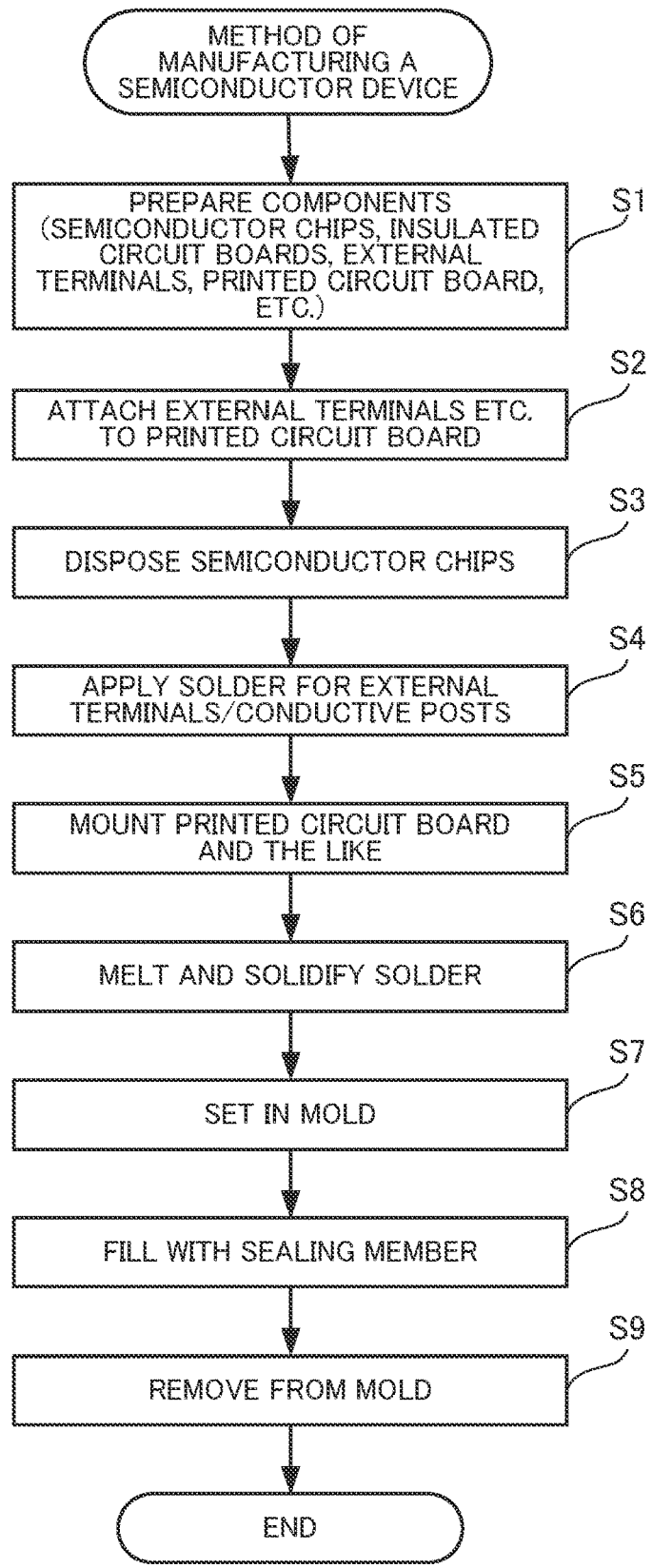
FIG. 5 is a flowchart of a method of manufacturing the semiconductor device according to the first embodiment.
Figure 6:
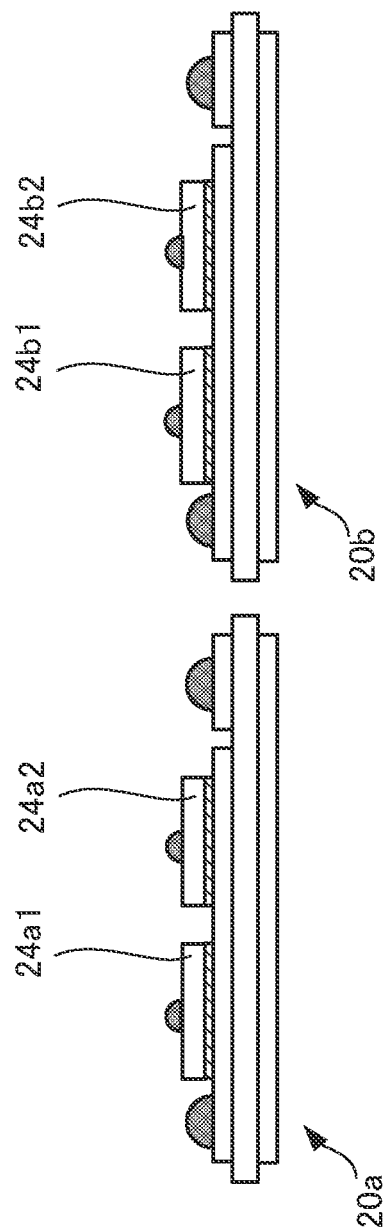
FIG. 6 depicts application of solder in the method of manufacturing a semiconductor device according to the first embodiment.
Figure 8:
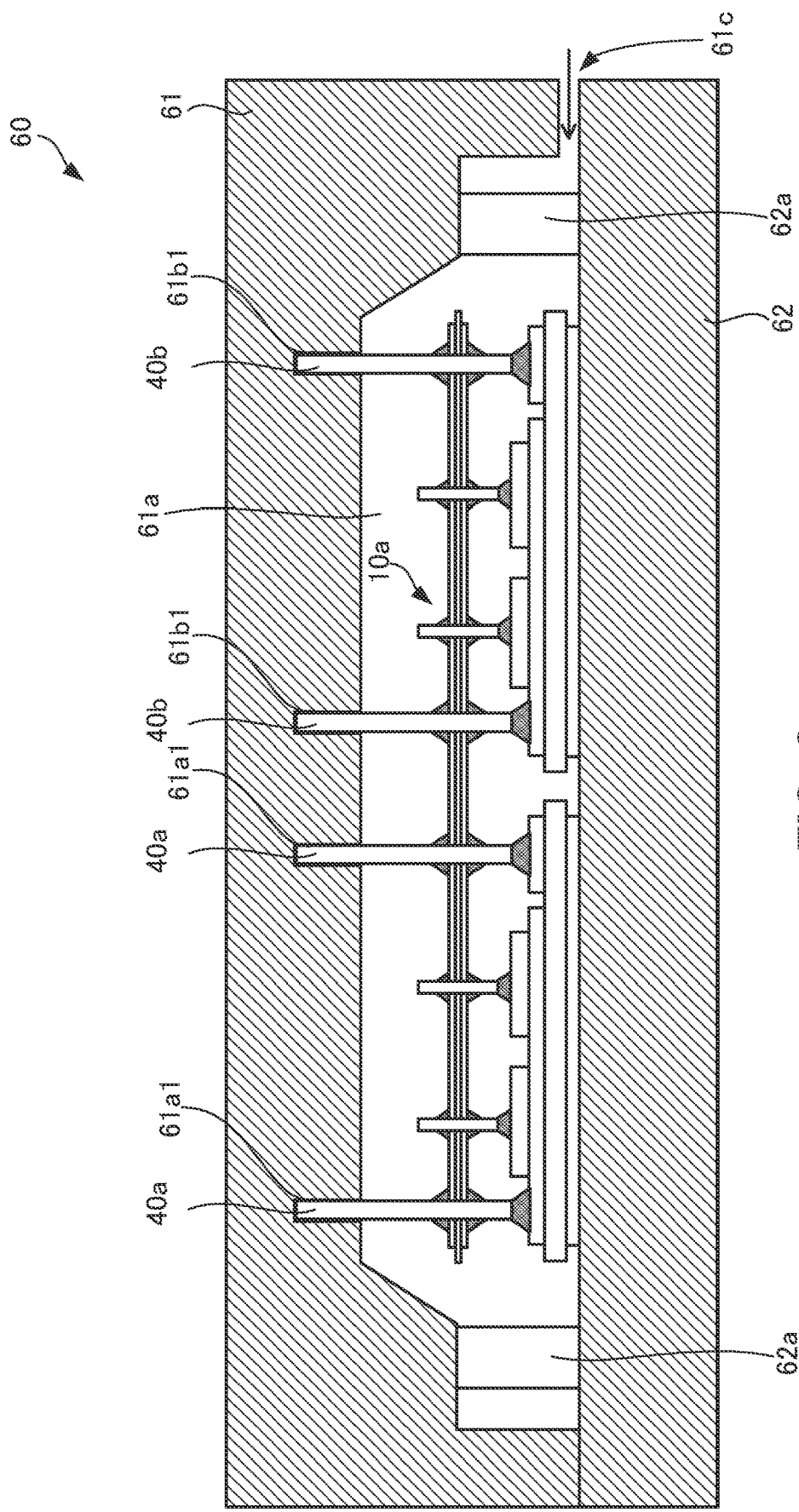
FIG. 8 depicts molding in the method of manufacturing a semiconductor device according to the first embodiment.

Next, a method of manufacturing the semiconductor device 10 described above will be described with reference to FIGS. 5 to 8. FIG. 5 is a flowchart of a method of manufacturing the semiconductor device according to the first embodiment. FIG. 6 depicts the application of solder in the method of manufacturing a semiconductor device according to the first embodiment. FIGS. 7A and 7B depict mounting of a printed circuit board and the like in the method of manufacturing a semiconductor device according to the first embodiment. FIG. 8 depicts molding in the method of manufacturing a semiconductor device according to the first embodiment.

First, the components used to manufacture the semiconductor device 10, that is, the semiconductor chips 24a1, 24a2, 24b1, and 24b2, the insulated circuit boards 20a and 20b, the external terminals 40a and 40b, the printed circuit board 30, the conductive posts 41a and 41b, solder, and the like, are prepared (step S1). Note that on the insulated circuit boards 20a and 20b, the buffer regions 36 are formed in advance for the through holes 34a and 34b, as depicted in FIGS. 3 and 4A and 4B for example.

Next, the external terminals 40a and 40b are press-fitted into the through holes 34a of the printed circuit board 30 so that one end portion of each external terminal 40a and 40b passes through. The conductive posts 41a and 41b are also press-fitted into the through holes 34b of the printed circuit board 30 so that one end portion of each conductive post 41a and 41b passes through. By doing so, the external terminals 40a and 40b and the like are attached to the printed circuit board 30 (step S2).

Next, the insulated circuit boards 20a and 20b are disposed at predetermined positions. The semiconductor chips 24a1, 24a2, 24b1, and 24b2 are then disposed on the upper circuit patterns 32 of the insulated circuit boards 20a and 20b via solder plates (step S3). After this, solder is applied by a dispenser on the main surfaces of the semiconductor chips 24a1, 24a2, 24b1, and 24b2 and the upper circuit patterns 32 to which the external terminals 40a and 40b are to be connected (step S4). Note that the conductive posts 41a and 41b are connected to the main surfaces of the semiconductor chips 24a1, 24a2, 24b1, and 24b2. Accordingly, as depicted in FIG. 6, amounts of solder are applied in keeping with the sizes of the conductive posts 41a and 41b and the external terminals 40a and 40b.

Next, in step S2, the printed circuit board 30 to which the conductive posts 41a and 41b and the external terminals 40a and 40b have been attached is disposed facing the insulated circuit boards 20a and 20b. After this, as depicted in FIG. 7A, the conductive posts 41a and 41b and the external terminals 40a and 40b are moved toward the insulated circuit boards 20a and 20b. As a result, the printed circuit board 30 is mounted on the insulated circuit boards 20a and 20b with one end portion of each of the conductive posts 41a and 41b and one end portion of each of the external terminals 40a and 40b immersed in the solder (step S5). Note that at this time, on the printed circuit board 30, solder has been applied to the locations where the conductive posts 41a and 41b and the external terminals 40a and 40b are press-fitted into the through holes 34a and 34b. In this state, heating is performed to melt the solder, which then cools and solidifies (step S6). By doing so, the conductive posts 41a and 41b are connected by solder to the semiconductor chips 24a1, 24a2, 24b1, and 24b2. The external terminals 40a and 40b are also connected by solder to the upper circuit patterns 32 of the insulated circuit boards 20a and 20b. Note that the structure configured in this way is hereinafter referred to as the "semiconductor structure 10a" as indicated in FIG. 7B.

Next, the semiconductor structure 10a configured in this way is set in a mold 60 as depicted in FIG. 8 (step S7). The mold 60 has an upper mold portion 61 and a lower mold portion 62. The upper mold portion 61 and the lower mold portion 62 are made of a material with superior thermal resistance. Example materials include composite ceramic materials and carbon. The mold 60, which is a combination of the upper mold portion 61 and the lower mold portion 62, has a cavity 61a, a locate ring 62a provided between the upper mold portion 61 and the lower mold portion 62, and an injection port 61c.

The cavity 61a is a housing formed by the upper mold portion 61 and a lower mold portion 62. The cavity 61a is provided with terminal housing portions 61a1 and 61b1 that accommodate the external terminals 40a and 40b of the semiconductor structure 10a. When the semiconductor structure 10a has been set inside the cavity 61a, the external terminals 40a and 40b are accommodated in the terminal housing portions 61a1 and 61b1. Note that accommodation of the external terminals 40a and 40b in the terminal housing portions 61a1 and 61b1 will be described in detail later. The locate ring 62a is used to align the upper mold portion 61 with the lower mold portion 62 and is attached to an outermost part of the mold 60. The injection port 61c is provided in a side portion of the mold 60 and is a channel for a sealing member in a molten state and passes through to the inside of the cavity 61a from the outside of the mold 60.

After the semiconductor structure 10a has been set in this way in the cavity 61a, molten sealing member is injected from the injection port 61c into the mold 60. The injected sealing member fills the cavity 61a and solidifies (step S8). After the sealing member 50 has sufficiently solidified to seal the semiconductor structure 10a, the upper mold portion 61 and the lower mold portion 62 are separated (that is, the mold 60 is opened) (step S9). By doing so, the semiconductor device 10 depicted in FIG. 1 is obtained.

Figure 9B:
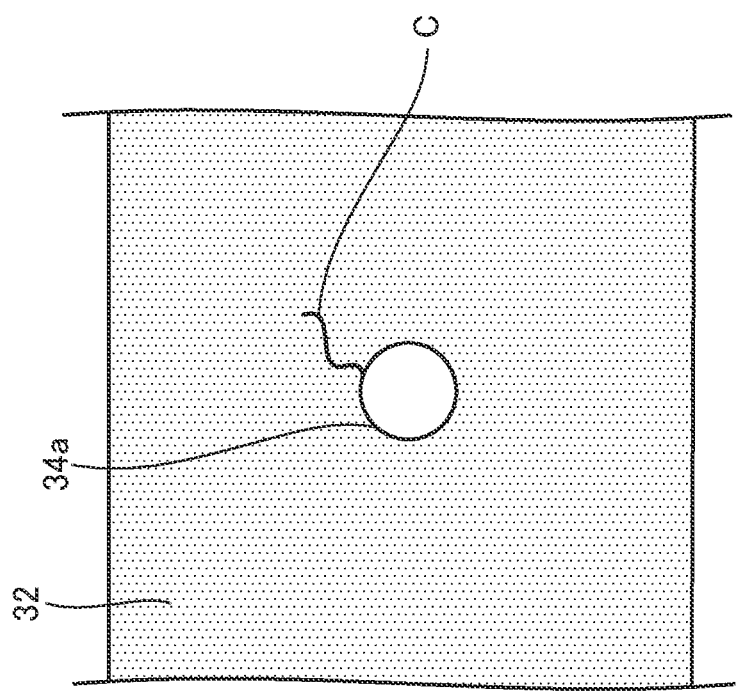
FIGS. 9A and 9B depict cracks at through holes of a printed circuit board that is a comparative example.
Figure 9A:
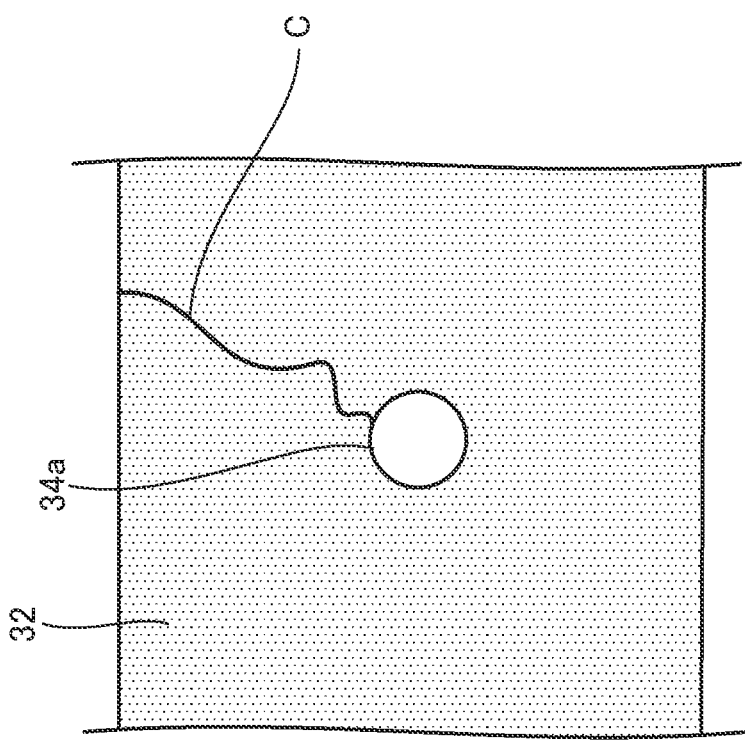
Figure 10B:
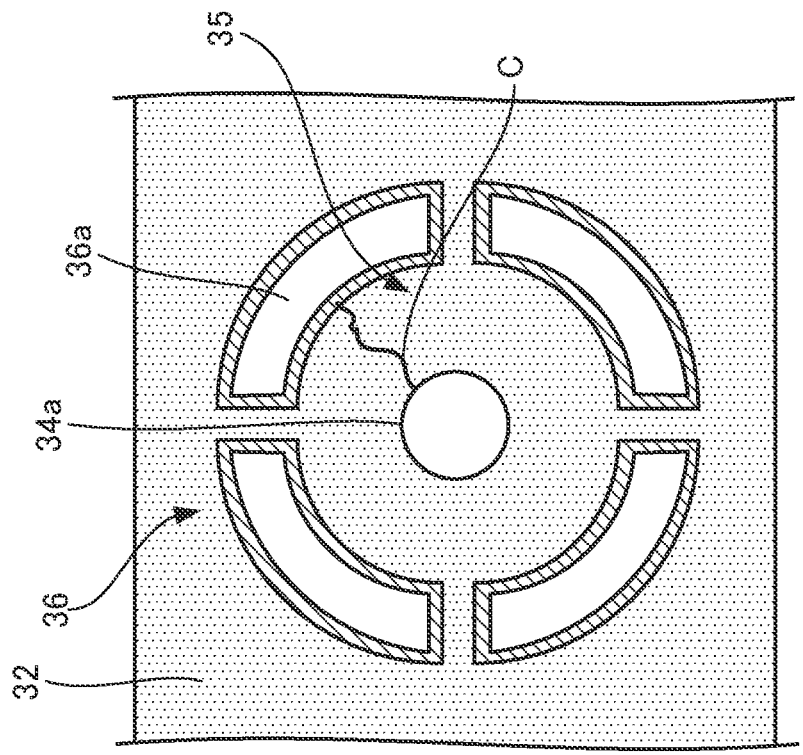
FIGS. 10A and 10B depict cracks at a through hole in the printed circuit board included in the semiconductor device according to the first embodiment.
Figure 10A:
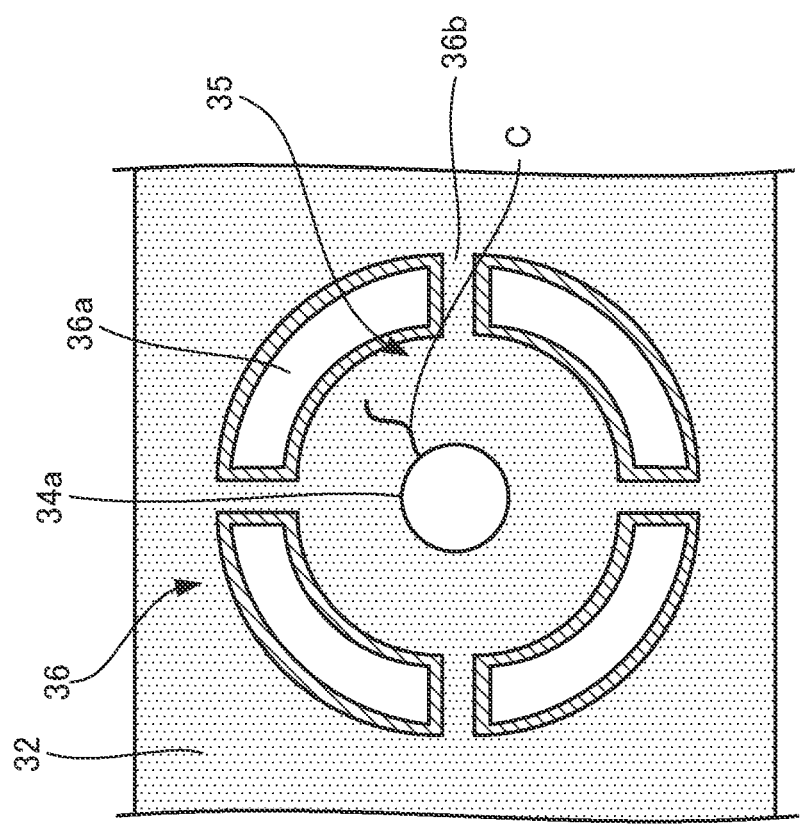

Next, the setting of the semiconductor structure 10a in the mold 60 in step S7 above will be described in detail with reference to FIGS. 9A and 9B and FIGS. 10A and 10B. FIGS. 9A and 9B depict cracks at the through holes of a printed circuit board that is a comparative example. FIGS. 10A and 10B depict cracks at the through holes in a printed circuit board included in a semiconductor device according to the first embodiment. Note that the comparative example in FIGS. 9A and 9B is a configuration where the buffer regions 36 described in the first embodiment are not formed. In FIGS. 9A and 9B, components that are the same as in the first embodiment have been assigned the same reference numerals and description thereof is omitted. FIGS. 9A and 9B and FIGS. 10A and 10B are enlargements of the vicinity of the through hole 34a. FIGS. 9A and 10A depict cases where a crack C has occurred at the through hole 34a, and FIGS. 9B and 10B depict cases where the crack C that has occurred at the through hole 34a has propagated. Note that FIGS. 9A and 9B and FIGS. 10A and 10B have been simplified and indicate only the reference numerals used in this description. FIGS. 9A and 9B and FIGS. 10A and 10B illustrate example cases of cracking occurring at a through hole 34a. This description is not limited to the through holes 34a and also applies to the through holes 34b.

In step S7 in FIG. 5, the semiconductor structure 10a is set at a predetermined position on the lower mold portion 62, and the upper mold portion 61 is attached from above. When dimensional tolerances exist for any of the external terminals 40a and 40b, there will be fluctuations in the heights of the external terminals 40a and 40b in the semiconductor structure 10a. When a semiconductor structure 10a like this is covered with the upper mold portion 61, one or more of the external terminals 40a and 40b will not be properly accommodated in the terminal housing portions 61a1 and 61b1 of the upper mold portion 61 and will be subjected to a pressing force.

The end portions of the external terminals 40a and 40b are firmly joined with solder to the upper circuit patterns 32. In the comparative example, buffer regions 36 are not formed on the printed circuit board 30. For this reason, when one or both of the external terminals 40a and 40b is/are pressed by the upper mold portion 61, the pressed external terminal(s) 40a and 40b will deform due to bending or the like. Due to this deformation of the external terminals 40a and 40b, the vicinity of the through holes 34a on the printed circuit board 30 into which the external terminals 40a and 40b have been press-fitted will also deform. As a result, as depicted in FIG. 9A for example, the crack C will be produced at the through hole 34a. When a crack C has been produced, a region including the through hole 34a of the printed circuit board 30 will further deform due to any further deformation or the like of the external terminals 40a and 40b, so that the crack C will propagate outward from the through hole 34a. The through holes 34a in particular are provided near edge portions of an upper circuit pattern 32 as depicted in FIG. 2. This means that a crack C may propagate to extend across the upper circuit pattern 32 as depicted in FIG. 9B. In this case, electrical conduction by the upper circuit pattern 32 may be interrupted, which would cause a drop in reliability for the semiconductor device 10.

On the other hand, in the first embodiment, a buffer region 36 is formed around each through hole 34a. This means that as described earlier, the support region 35 of the printed circuit board 30, including the through hole 34a will warp in accordance with the torsion portions 36b that bend in keeping with any deformation of an external terminal 40a or 40b that is pressed by the upper mold portion 61. It is therefore possible to reduce damage to the printed circuit board 30. In this case, as depicted in FIG. 10A, a crack C may occur at the through hole 34a. This crack C produced at the through hole 34a may also propagate outward from the through hole 34a due to warping of the support region 35 of the printed circuit board 30. However, the first embodiment is configured with the buffer holes 36a formed in each buffer region 36. Accordingly, propagation of the crack C outward from the through hole 34a is blocked by the buffer holes 36a as depicted in FIG. 10B. This prevents the crack C from extending across the upper circuit pattern 32, so that electrical conductivity by the upper circuit pattern 32 is maintained. As a result, a drop in reliability of the semiconductor device 10 is suppressed.

The semiconductor device 10 described above includes the insulated circuit boards 20a and 20b, the printed circuit board 30 with the through holes 34a that pass through between the main surfaces, and the external terminals 40a and 40b that are press-fitted into the through holes 34a so as to pass through the through holes 34a and have end portions that are fixed to the front surfaces of the insulated circuit boards 20a and 20b. The printed circuit board 30 also includes, on the main surfaces, the support regions 35, which include the through holes 34a and 34b, and buffer regions 36 where the buffer holes 36a are provided as openings so as to leave torsion portions 36b that are connected to the support regions 35. The support regions 35 on the printed circuit board 30 that include the through holes 34a warp in keeping with bending of the torsion portions 36b that accompanies deformation of the external terminals 40a and 40b. This means that it is possible to reduce the occurrence and scale of damage to the printed circuit board 30. With this configuration, even when a crack C is produced at a through hole 34a, propagation of the crack C outward from the through hole 34a is blocked by the buffer holes 36a. This means that a crack C will not extend across an upper circuit pattern 32, so that the electrical conductivity of the upper circuit pattern 32 is maintained. As a result, a drop in the reliability of the semiconductor device 10 is suppressed.

Next, various forms of the buffer regions 36 formed around the support regions 35 that include the through holes 34a will be described with reference to FIGS. 11A and 11B.

Figure 11B:
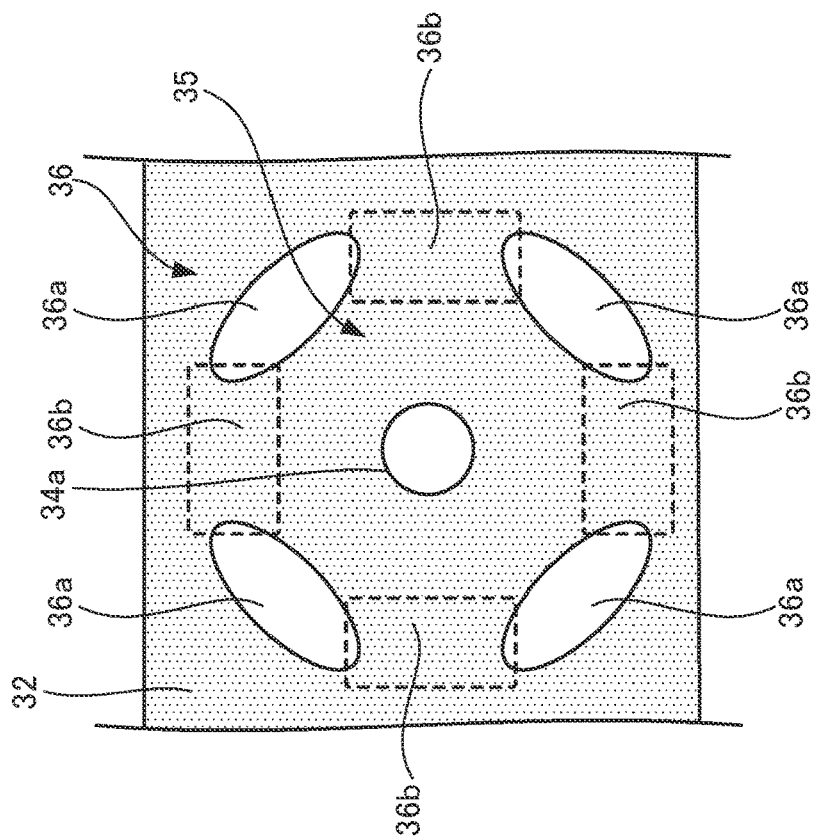
FIGS. 11A and 11B are enlarged plan views of other through holes formed in the printed circuit board included in the semiconductor device according to the first embodiment.
Figure 11A:
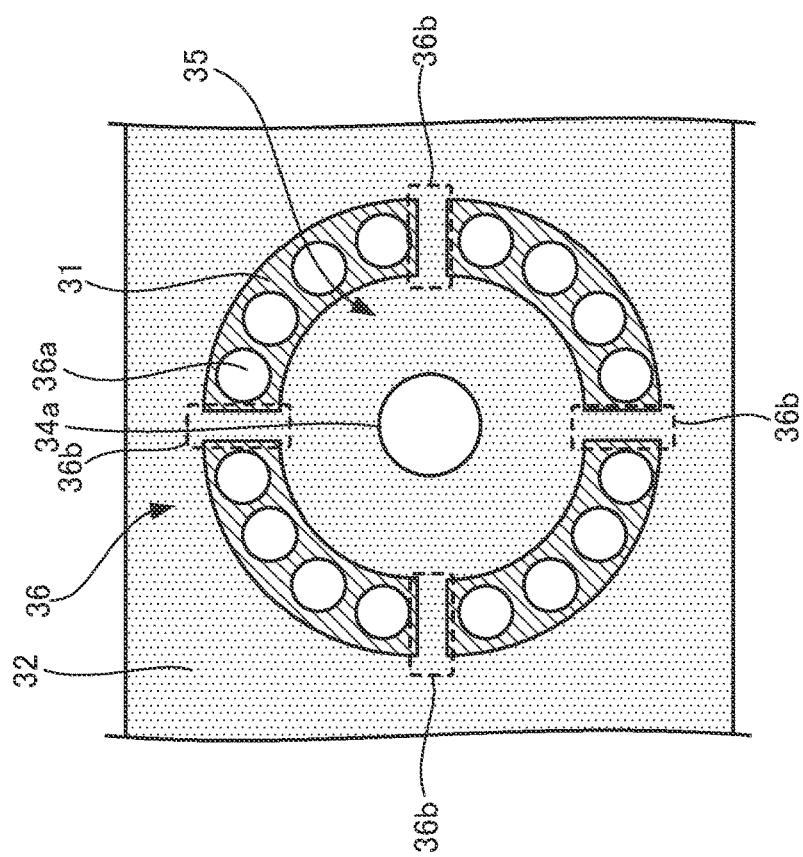

FIGS. 11A and 11B are enlarged plan views of other through holes formed in a printed circuit board included in the semiconductor device according to the first embodiment. Note that FIGS. 11A and 11B depict different forms of buffer region.

In FIG. 11A, in the same way as the description above, a buffer region 36 is formed around a support region 35 which includes a through hole 34a. In FIG. 11A, unlike the first embodiment, the upper circuit pattern 32 is removed in the buffer region 36 to form four openings, which expose the insulating board 31, at equal intervals around the circumference of the support region 35. Four buffer holes 36a are formed in each of these regions that is an opening in the upper circuit pattern 32. The torsion portions 36b are located between the adjacent openings in the upper circuit pattern 32 and connect the support region 35 and the region outside the buffer region 36. In this configuration, one opening or, three or two openings at equal intervals may be formed in the upper circuit pattern 32. The torsion portions 36b are formed between adjacent openings. The number of buffer holes 36a formed within these openings is not limited to four and the shape is not limited to circular, so that any number of buffer holes 36a may be provided depending on the openings and the shape may be rectangular, triangular, or elliptical. In the example in FIG. 11A, the exposed areas of the insulating board are wider than the areas in FIG. 3. This improves adhesion with the sealing member 50. In addition, the bonding of the external terminals 40a and 40b to the through holes 34a by solder is improved. Accordingly, a reliable seal is achieved by the sealing member 50 even in a state where a support region 35 has warped due to deformation of an external terminal 40a or 40b that has been pressed.

Also, in FIG. 11B, the buffer region 36 includes four buffer holes 36a, which are formed around a support region 35 including a through hole 34a, and torsion portions 36b, which are formed between the adjacent buffer holes 36a. The buffer holes 36a are formed at equal intervals around the support region 35 so as to pass through from the front surface to the rear surface of the printed circuit board 30. The buffer holes 36a are elliptical when seen from above and are formed so that lines that join the centers of the respective ellipses and the center of the through hole 34a are perpendicular to the major axes of the ellipses. The insulating board 31 may be exposed around the buffer holes 36a in the same way as in FIG. 3. The width and shape of the torsion portions 36b differ according to the shape, size, and number of the buffer holes 36a and the intervals between the adjacent buffer holes 36a. The torsion portions 36b in FIG. 11B are mere examples.

Second Embodiment

Figure 12B:
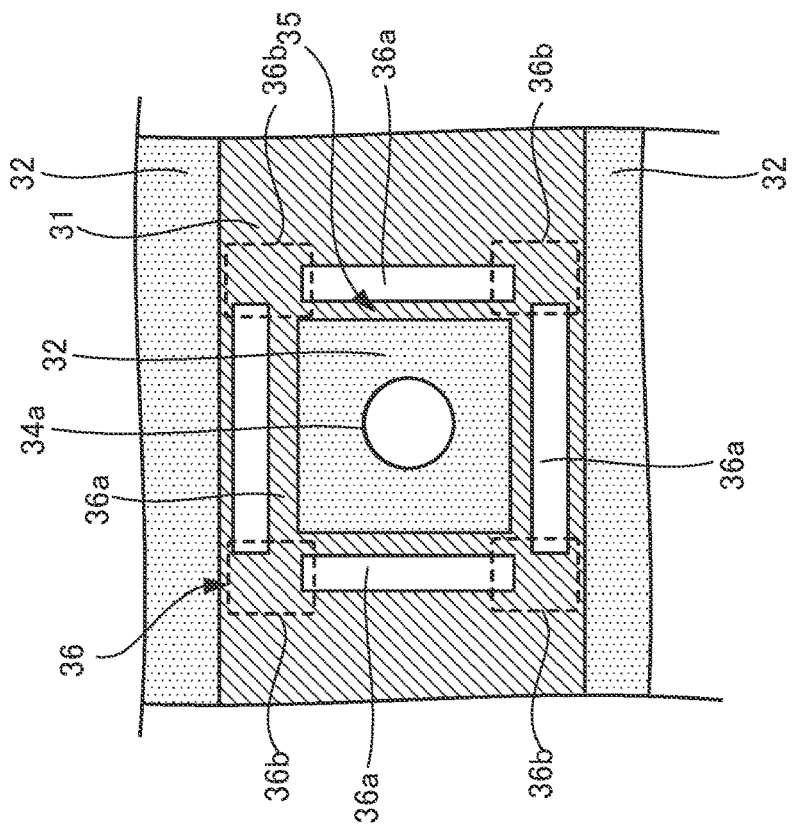
FIGS. 12A and 12B are enlarged plan views of the through holes in a printed circuit board included in a semiconductor device according to the second embodiment.
Figure 12A:
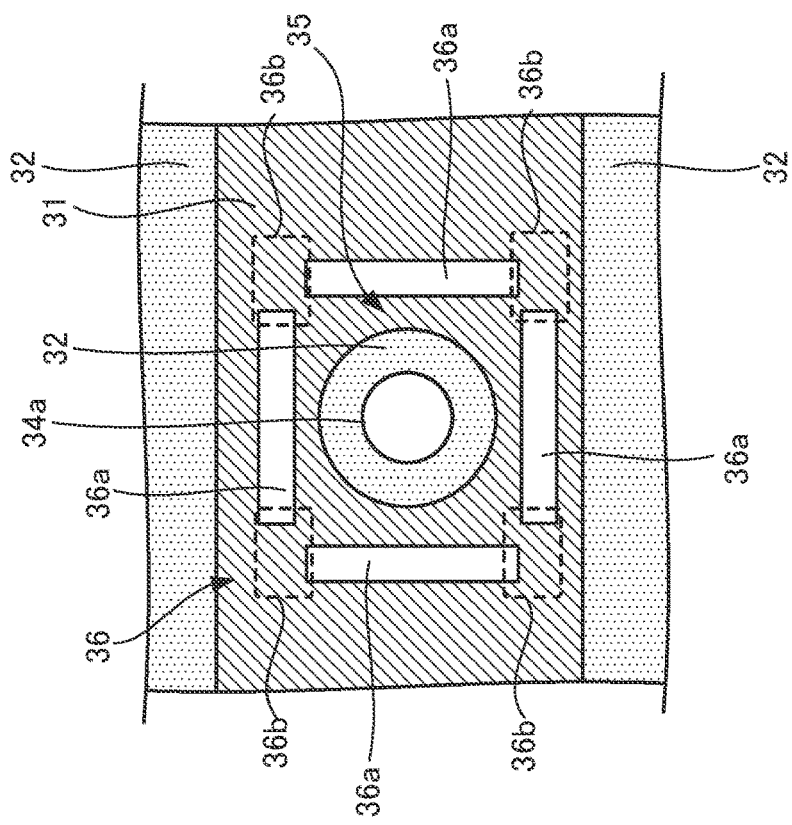
Figure 13B:
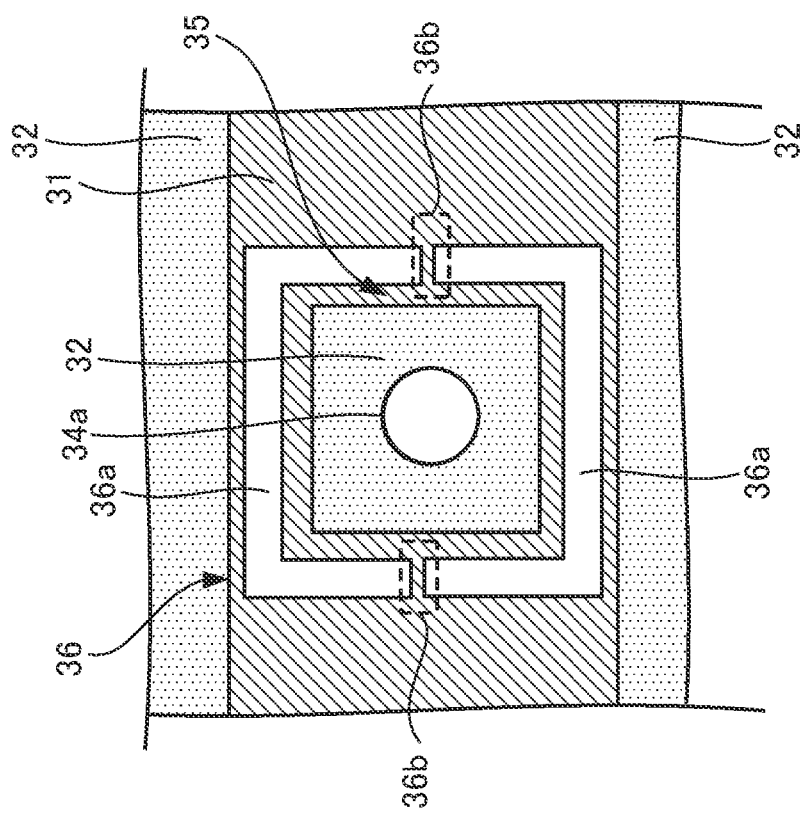
FIGS. 13A and 13B are enlarged plan views of the through holes in a printed circuit board included in a semiconductor device according to the second embodiment.
Figure 13A:
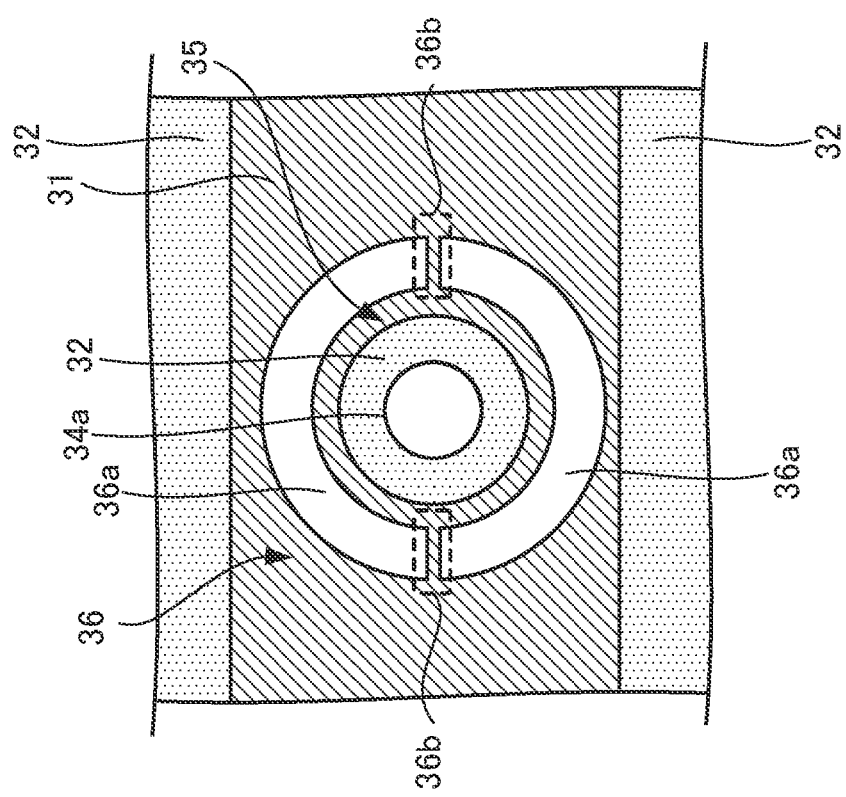

For this second embodiment, an example where a buffer region is formed on a printed circuit board configured so that an upper circuit pattern 32 is formed around the through hole 34a in the insulating board 31 will be described with reference to FIGS. 12A and 12B and FIGS. 13A and 13B. FIGS. 12A and 12B and FIGS. 13A and 13B are enlarged plan views of the through holes in a printed circuit board included in a semiconductor device according to the second embodiment. Note that on the printed circuit boards 30 in FIGS. 12A and 12B and FIGS. 13A and 13B, one upper circuit pattern 32 is formed so as to surround a through hole 34a in the insulating board 31, and upper circuit patterns 32 may be formed in the upper and lower parts in the drawing so as to be separated from this upper circuit pattern. FIGS. 12A and 13A depict configurations where the upper circuit pattern 32 around the through hole 34a is circular, and FIGS. 12B and 13B depict configurations where the upper circuit pattern 32 around the through hole 34a is square.

In FIG. 12A, the printed circuit board 30 is equipped with the support region 35, which includes the through hole 34a and the upper circuit pattern 32 that is circular and is provided around the through hole 34a, and the buffer region 36 that is formed around the support region 35. The buffer region 36 is substantially rectangular. The buffer region 36 has rectangular buffer holes 36a, which are formed so as to surround the support region 35 on four sides, and torsion portions 36b provided between adjacent buffer holes 36a. In FIG. 12B, the upper circuit pattern 32 provided around the through hole 34a is quadrangular. Note that the shape, number, size, and formation locations of the buffer holes 36a illustrated here are mere examples.

In FIG. 13A, the printed circuit board 30 is equipped with the support region 35, which includes the through hole 34a and the upper circuit pattern 32 that is circular and is provided around the through hole 34a, and the buffer region 36 that is formed around the support region 35. The buffer region 36 is circular. The buffer region 36 has semicircular buffer holes 36a, which are formed so as to surround the support region 35, and torsion portions 36b between adjacent buffer holes 36a. In FIG. 13B, the upper circuit pattern 32 provided around the through hole 34a in FIG. 13A is quadrangular. For this reason, the printed circuit board 30 has a support region 35 that is rectangular when seen from above and a quadrangular buffer region 36 that surrounds the periphery of the support region 35. Note that the shape, number, size, and formation locations of the buffer holes 36a given here are mere examples.

With the configurations depicted in FIGS. 12A and 12B and FIGS. 13A and 13B, in the same way as the first embodiment, when the external terminals 40a and 40b are press-fitted into the through holes 34a and set in the mold 60, a support region 35 on the printed circuit board 30 including a through hole 34a will warp in accordance with bending of the torsion portions 36b as a pressed external terminal 40a or 40b deforms. It is therefore possible to reduce damage to the printed circuit board 30. Also, even when a crack from the upper circuit pattern 32 around the through hole 34a propagates outward and crosses the support region 35, the crack will be blocked by a buffer hole 36a. This means that the crack will not cross the insulating board 31, which suppresses any drop in withstand voltage.

According to the present embodiments, it is possible to suppress the occurrence of damage to a printed circuit board and to suppress a drop in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a first board;
   a second board having a plurality of through holes passing therethrough; and a plurality of external terminals that are respectively press-fitted into the plurality of through holes of the second board, one end portion of each external terminal passing through the corresponding through hole and being fixed to a front surface of the first board, wherein the second board is a printed circuit board that further includes, in a top view thereof, a plurality of support regions, each having one of the plurality of through holes formed therein, and a plurality of buffer regions respectively surrounding the plurality of support regions, each buffer region having at least one buffer hole and at least one torsion portion formed therein, the at least one torsion portion being connected to the support region surrounded by said each buffer region.

2. The semiconductor device according to claim 1, wherein each of the plurality of support regions is of a circular shape, and in each of the plurality of buffer regions, the at least one buffer hole is positioned around an outer circumference of the support region surrounded by said each buffer region.

3. The semiconductor device according to claim 2, wherein in each of the plurality of buffer regions, the at least one buffer hole includes a plurality of buffer holes positioned around the outer circumference of the support region surrounded by said each buffer region, and the at least one torsion portion includes a plurality of torsion portions that support the support region surrounded by said each buffer region.

4. The semiconductor device according to claim 1, wherein the printed circuit board includes an insulating board and a circuit pattern formed on a front surface of the insulating board, and in each of the plurality of buffer regions, the front surface of the insulating board is exposed around a peripheral portion of the at least one buffer hole.

5. The semiconductor device according to claim 4, wherein in each of the plurality of buffer regions, the at least one buffer hole includes a plurality of buffer holes, the plurality of buffer holes being respectively formed in a plurality of regions, in each of which the front surface of the insulating board is exposed, and each of the at least one torsion portion is formed between adjacent two of the plurality of regions.

6. The semiconductor device according to claim 4, wherein the circuit pattern is formed in a region of the printed circuit board that includes the plurality of through holes, and the plurality of buffer regions are formed on the insulating board to surround the circuit pattern.

7. The semiconductor device according to claim 1, wherein the first board is an insulated circuit board.

* * * * *